United States Patent
Sancheti (10) Patent No.: US 7,233,183 B1
(45) Date of Patent: Jun. 19, 2007

(54) WIDE FREQUENCY RANGE DLL WITH DYNAMICALLY DETERMINED VCDL/VCO OPERATIONAL STATES

(75) Inventor: Sanjay K. Sancheti, Starkville, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/774,180

(22) Filed: Feb. 6, 2004

Related U.S. Application Data (60) Provisional application No. 60/450,761, filed on Feb. 27, 2003.

(51) Int. Cl.
*H03L 7/06* (2006.01)

(52) U.S. Cl. .................. 327/158; 327/149; 327/156; 331/11

(58) Field of Classification Search ............ 327/141, 327/156–160, 147–149; 331/1 A, 11, 17
See application file for complete search history.

(56) References Cited

U.S. PATENT DOCUMENTS

| | | | |
|---|---|---|---|
| 4,069,462 A * | 1/1978 | Dunn | 331/11 |
| 5,420,543 A * | 5/1995 | Lundberg et al. | 331/1 A |
| 5,491,458 A | 2/1996 | McCune | |
| 5,651,035 A | 7/1997 | Tozun | |
| 5,886,582 A | 3/1999 | Stansell | |
| 5,952,888 A | 9/1999 | Scott | |
| 6,043,717 A * | 3/2000 | Kurd | 331/17 |
| 6,172,571 B1 | 1/2001 | Moyal | |
| 6,211,741 B1 | 4/2001 | Dalmia | |
| 6,272,646 B1 | 8/2001 | Rangasayee | |
| 6,307,413 B1 | 10/2001 | Dalmia | |
| 6,310,521 B1 | 10/2001 | Dalmia | |
| 6,369,660 B1 | 4/2002 | Wei | |
| 6,377,646 B1 | 4/2002 | Sha | |
| 6,445,211 B1 | 9/2002 | Saripella | |
| 6,466,078 B1 | 10/2002 | Stiff | |
| 6,553,057 B1 | 4/2003 | Sha | |
| 6,560,306 B1 | 5/2003 | Duffy | |
| 6,667,642 B1 | 12/2003 | Moyal | |
| 6,683,930 B1 | 1/2004 | Dalmia | |
| 6,690,224 B1 | 2/2004 | Moore | |
| 6,704,381 B1 | 3/2004 | Meyers | |
| 6,782,068 B1 | 8/2004 | Wilson | |
| 6,850,554 B1 | 2/2005 | Sha | |
| 6,937,077 B2 * | 8/2005 | Zarate et al. | 327/158 |

FOREIGN PATENT DOCUMENTS

JP 40422314 A * 8/1992

\* cited by examiner

*Primary Examiner*—Dinh T. Le

(57) ABSTRACT

In one embodiment of the present invention, a phase generator, comprising a plurality of delay blocks, is coupled in a feedback loop with a phase detector. When in an open loop mode, the phase generator is operable as a voltage controlled delay line. The phase detector compares an input signal with a first output signal of the phase generator and generates a first control signal based thereon. The phase generator is also coupled in a feedback loop with a phase-frequency detector. When in a closed loop mode, the phase generator is operable as a voltage controlled oscillator and the phase-frequency detector compares the input signal with a second output signal of the phase generator. The phase-frequency detector then generates a second control signal based thereon.

8 Claims, 7 Drawing Sheets

WIDE FREQUENCY RANGE DLL WITH DYNAMICALLY DETERMINED VCDL/VCO OPERATIONAL STATES

RELATED U.S. PATENT APPLICATION

This patent application claims benefit from provisional patent application Ser. No. 60/450,761 filed Feb. 27, 2003 entitled, :Wide Frequency Range DLL with Dynamically Determined VCDL/VCO Stages," by Sanjay K. Sancheti, which is also hereby incorporated herein by reference.

FIELD OF THE INVENTION

Embodiments of the present invention relate to electronic circuitry and more particularly to timing circuitry and delay lock loops (DLLs).

BACKGROUND OF THE INVENTION

In electronic systems, good clock distribution is very important to the overall performance of a product. Unwanted clock skew and jitter are two phenomena that may result from poor clock distribution, thus causing problems in the design and operation of the electronic systems.

Techniques have been developed using phase lock loops (PLLs) and delay lock loops (DLLs) to successfully address these problems and reduce both to manageable levels. However, conventional solutions are not without some disadvantages. One conventional solution includes the use of a PLL and another, the use of a DLL. A typical PLL circuit of the conventional art is shown in FIG. 1, and a typical DLL circuit of the conventional art is shown in FIG. 2.

Figure 1:
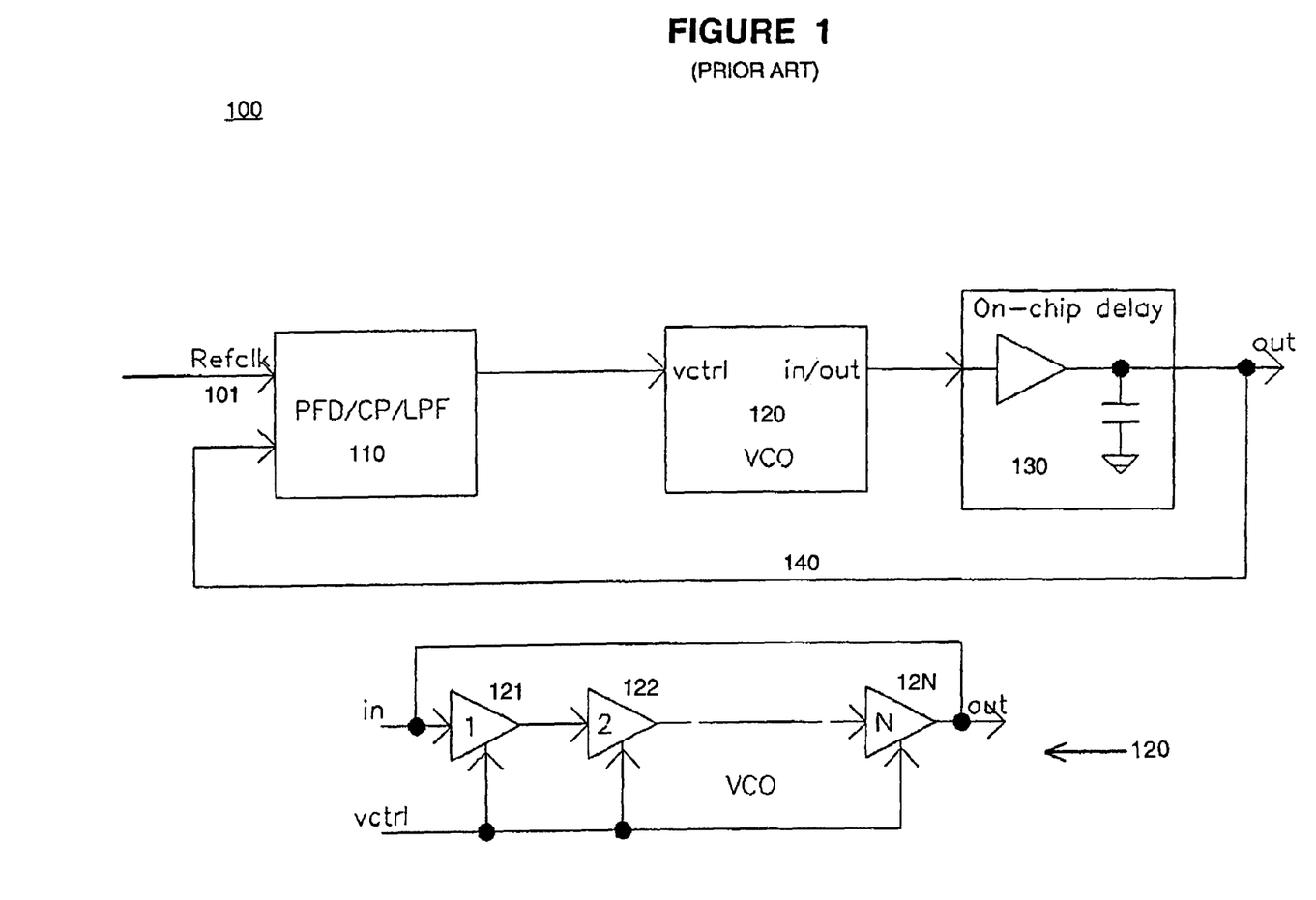
FIG. 1 shows an exemplary prior art phase locked loop (PLL).
Figure 2:
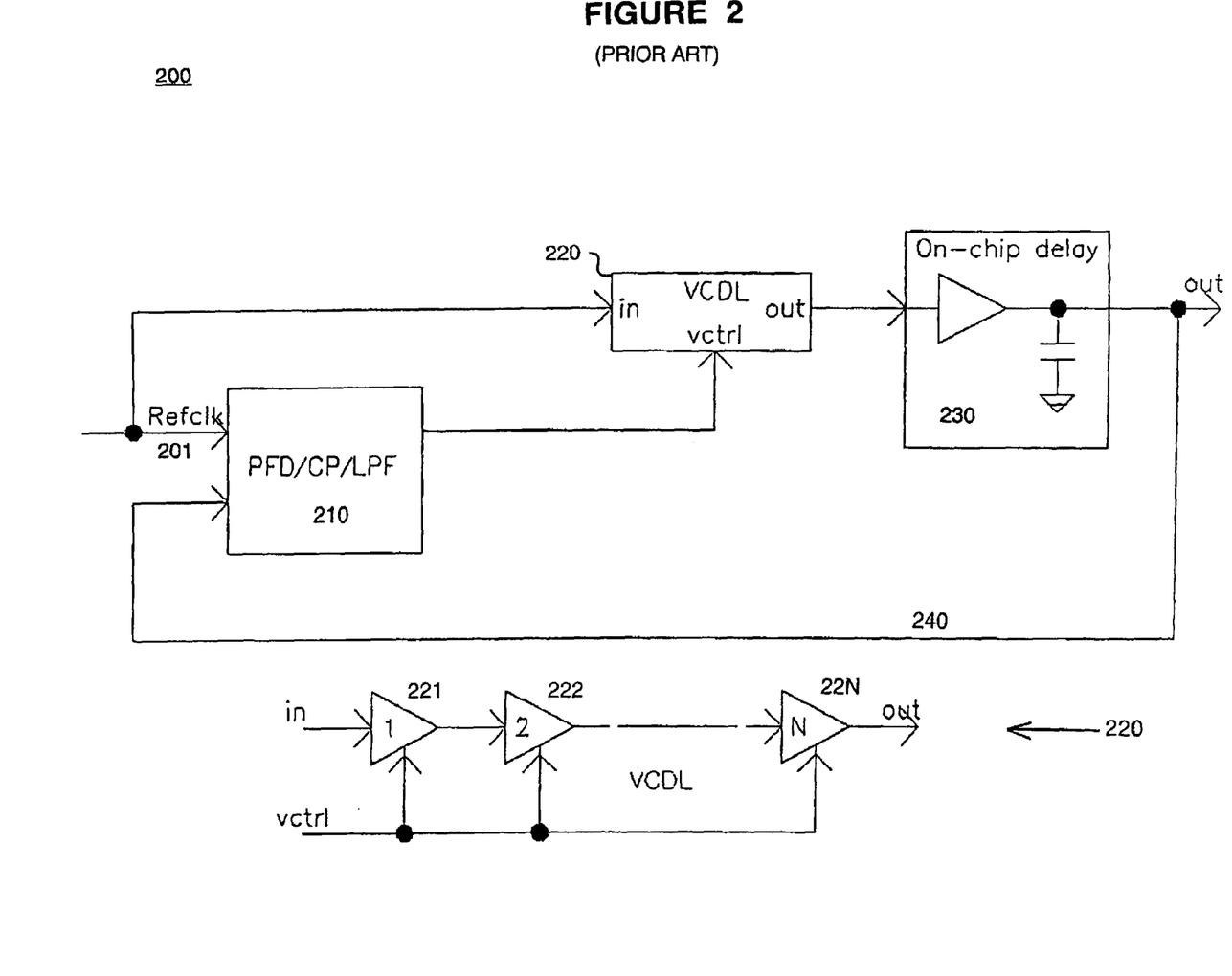
FIG. 2 shows an exemplary prior art delay lock loop (DLL).

FIG. 1 shows an exemplary PLL circuit 100 of the conventional art comprising a reference clock input (Refclk) 101 to a block 110 comprising a phase-frequency detector (PFD), a charge pump (CP), and a low pass filter (LPD). In FIG. 1, the output of the phase frequency detector is input to the charge pump, which in turn drives the low pass filter. The output of the PFD/CP/LPF block 110 is a voltage (vctrl) which is input to, and controls, a voltage controlled oscillator (VCO) 120 comprising a plurality of delay stages. The output of VCO 120 is input to an on-chip delay element 130, comprising a buffer, a capacitor connected between the output of the buffer and ground, and an output of block 130. A feedback path 140 couples the output of on-chip delay element 130 to an input of PFD/CP/LPF block 110. The lower part of FIG. 1 shows the multiple delay stages (e.g., delay stages 121, 122, and 12N) in VCO 120. Importantly, the circuit 100 of FIG. 1 operates in closed loop fashion only.

In PLL 100, the phase frequency detector of PFD/CP/LPF block 110 compares the phase difference between the Refclk signal 105 and the output clock signal received via feedback path 140. Depending on the phase difference between the two signals, PFD/CP/LPF block 110 will change the vctrl voltage supplied to VCO 120, which modulates the frequency of the oscillator.

With regard to PLL 100, phase lock loops have certain advantages, e.g., PLLs can suppress skew in digital systems (e.g., clock to data out delay) and can generate multiple phases of output clocks. However, PLLs cannot operate over a wide frequency range or at a low supply voltage.

FIG. 2 shows an exemplary DLL circuit 200 of the conventional art comprising a reference clock input (Refclk) 201, a block 210 comprising a phase-frequency detector (PFD), a charge pump (CP), and a low pass filter (LPF). A voltage controlled delay element (VCDL) 220 comprises two inputs: one input is from Refclk 201; and the other is the output of the PFD/CP/LPF block 210. The output of VCDL 220 is coupled with an on-chip delay element 230 comprising a buffer, a capacitor connected between the output of the buffer and ground, and an output of block 230. A feedback path 240 couples the output of on-chip delay element 240 to an input of PFD/CP/LPF 210. The lower part of FIG. 1 shows the multiple delay stages (e.g., delay stages 221, 222, and 22N) in VCDL 220. As shown in FIG. 2, VCDL is a straight delay chain (e.g., open loop) and is not self-oscillatory like VCO 120 of FIG. 1.

In DLL circuit 200, the phase frequency detector of PFD/CP/LPF block 210 compares the phase difference between the Refclk signal 201 and the output clock signal received via feedback path 240. Depending on the phase difference between the two signals, PFD/CP/LPF block 210 will change the vctrl voltage supplied to VCDL 120, which modulates delay time through the delay stages 221–22N.

One DLL alone can either suppress skew in digital systems (e.g., clock to data out delay) or generate multiple phases for a limited frequency range. To achieve both of these, two DLLs must typically be used in series (in cascade), one for skew suppression and one for clock phase generation. However, when using more than one DLL in cascade, unwanted deterioration in jitter performance is exhibited as the errors introduced by each circuit are additive. Jitter may be defined as the uncertainty in the placement of the leading and trailing edges of the clock signal. Factors affecting jitter performance include process voltage, temperature, and switching condition noise. In other words, greater uncertainty in the placement of the clock edges is introduced when multiple DLLs are used achieve skew suppression and generate multiple clock phases.

SUMMARY OF THE INVENTION

Accordingly, a need exists for a circuit which generates multiple phases of a signal while suppressing clock skew. While meeting the above stated needs, it is further desirable for such a circuit to be operable over a wide frequency range and/or at a low supply voltage. Finally, while meeting the above stated needs, it is desirable for such a circuit to exhibit acceptable jitter characteristics. Embodiments of the present invention provide such circuits.

Embodiments of the present invention comprise a circuit which generates multiple phases of a signal while suppressing clock skew and utilize dynamically determined VCDL/VCO operational states. In so doing, embodiments of the present invention are operable over a wide frequency range and at a low supply voltages. Furthermore, embodiments of the present invention exhibit less jitter than cascaded DLL circuits.

In one embodiment of the present invention, a phase generator, comprising a plurality of delay blocks, is coupled in a feedback loop with a phase detector. As described below, the circuit can be dynamically configured between VCDL and VCO operational states. When in an open loop mode, the phase generator is operable as a voltage controlled delay line. The phase detector compares an input signal with a first output signal of the phase generator and generates a first control signal based thereon. This state performs coarse adjustment. The phase generator is also coupled in a feedback loop with a phase-frequency detector. When in a closed loop mode, the phase generator is operable as a voltage controlled oscillator and the phase-frequency detector compares the input signal with a second output signal of the phase generator. The phase-frequency detector then generates a second control signal based thereon. This stage performs fine adjustment.

The following is an exemplary description of embodiments of the present invention for generating a plurality of phases of an input signal. The input signal is received by both the phase detector and by the phase generator, which is initially configured to operate in an open loop mode as a voltage controlled delay line. The input signal passes through a plurality of configurable delay blocks of the phase generator and a first output signal from the phase generator is sent to the phase detector via a feedback loop.

Based upon a comparison of the input signal and the first output signal of the phase generator, the phase detector generates a control signal. In embodiments of the present invention, the control signal controls a plurality of multiplexors within the phase generator. More specifically, each of the delay blocks of the phase generator is comprised of a plurality of configurable delay elements. The multiplexor selectively couples the delay elements with the feedback loop. Thus, in the open loop mode, or "coarse adjustment" mode, the embodiment of the present invention is configured as a delay lock loop until a coarse match between the input signal and the first output signal of the phase generator is achieved.

In embodiments of the present invention, when the coarse match is achieved, the phase detector generates a reconfiguration signal which causes the phase generator to switch from the open loop mode to a closed loop mode. When this occurs, the phase generator is no longer adjusted by adding/subtracting additional delay elements. Instead, the circuit now functions as a phase locked loop which utilizes a phase-frequency detector to control the phase difference between the input signal and the signal output by the phase generator.

In embodiments of the present invention, this is accomplished by coupling an output of the phase generator with the phase-frequency detector in a feedback loop which is half the delay circuitry used in the coarse adjustment mode due to the nature of the VCO versus VCDL operational characteristics. In the "fine adjustment" mode, the phase-frequency detector compares the input signal with a second output signal from the phase generator, which is now operating as a phase locked loop. The phase-frequency detector then generates a control signal which controls the amount of delay for each of the delay elements coupled in the circuit and, thus, controls the phase difference between the input signal and the signal output by the phase generator.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

DETAILED DESCRIPTION OF THE PREFERRED EMBODIMENT

Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 3:
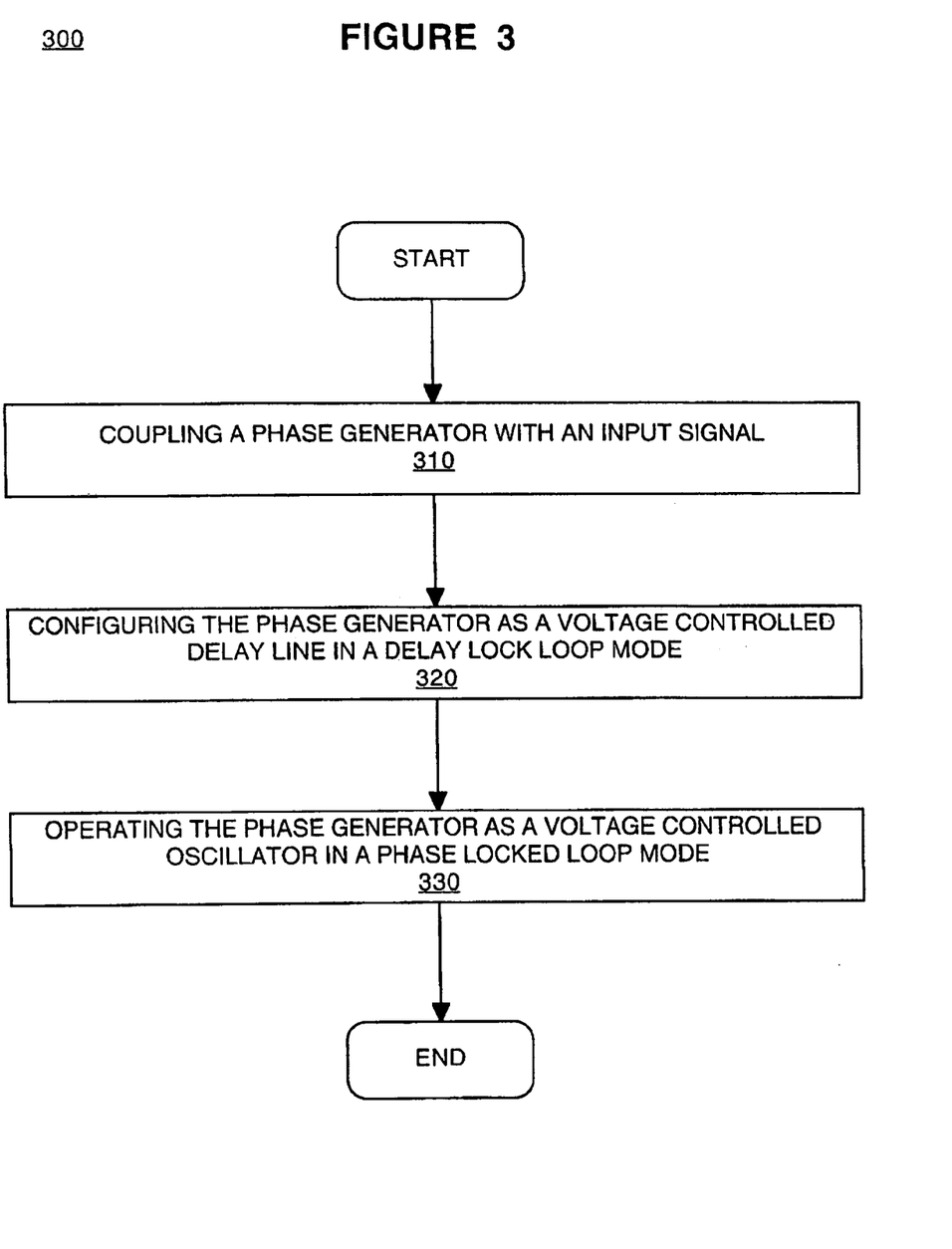
FIG. 3 is a flowchart of a method for generating multiple phases of an input signal in accordance with embodiments of the present invention.

FIG. 3 is a flowchart of a general method 300 for generating multiple phases of an input signal in accordance with embodiments of the present invention. In step 310 of flowchart 300, a phase generator is coupled with or otherwise accesses an input signal. In embodiments of the present invention, the phase generator comprises a chain of dynamically controlled delay blocks, each of which is comprised of a plurality of delay elements.

In step 320 of flowchart 300, the phase generator is configured in coarse adjustment mode as a voltage controlled delay line in a delay lock loop mode. As will be described in greater detail below, the circuit of the present invention is initially configured in a delay lock loop mode wherein the phase generator is operated as a voltage controlled delay line. A phase detector, coupled in feedback with the phase generator, compares the input signal with a signal output by the phase generator and generates a control signal which selectively couples the configurable number of delay elements of the phase generator with the feedback line. When a coarse match between the input signal and the signal output by the phase generator is determined, the phase detector generates a second control signal which switches the phase generator from the delay lock loop mode to a phase locked loop mode.

In step 330 of flowchart 300, the phase generator is operated in fine adjustment mode as a voltage controlled oscillator in a phase locked loop mode. When a coarse match between the input signal and the signal output by the phase generator is determined in step 320, the circuit of the present invention is then operated as a phase locked loop wherein the phase generator is operated as a voltage controlled oscillator coupled in feedback with a phase-frequency detector.

Figure 4:
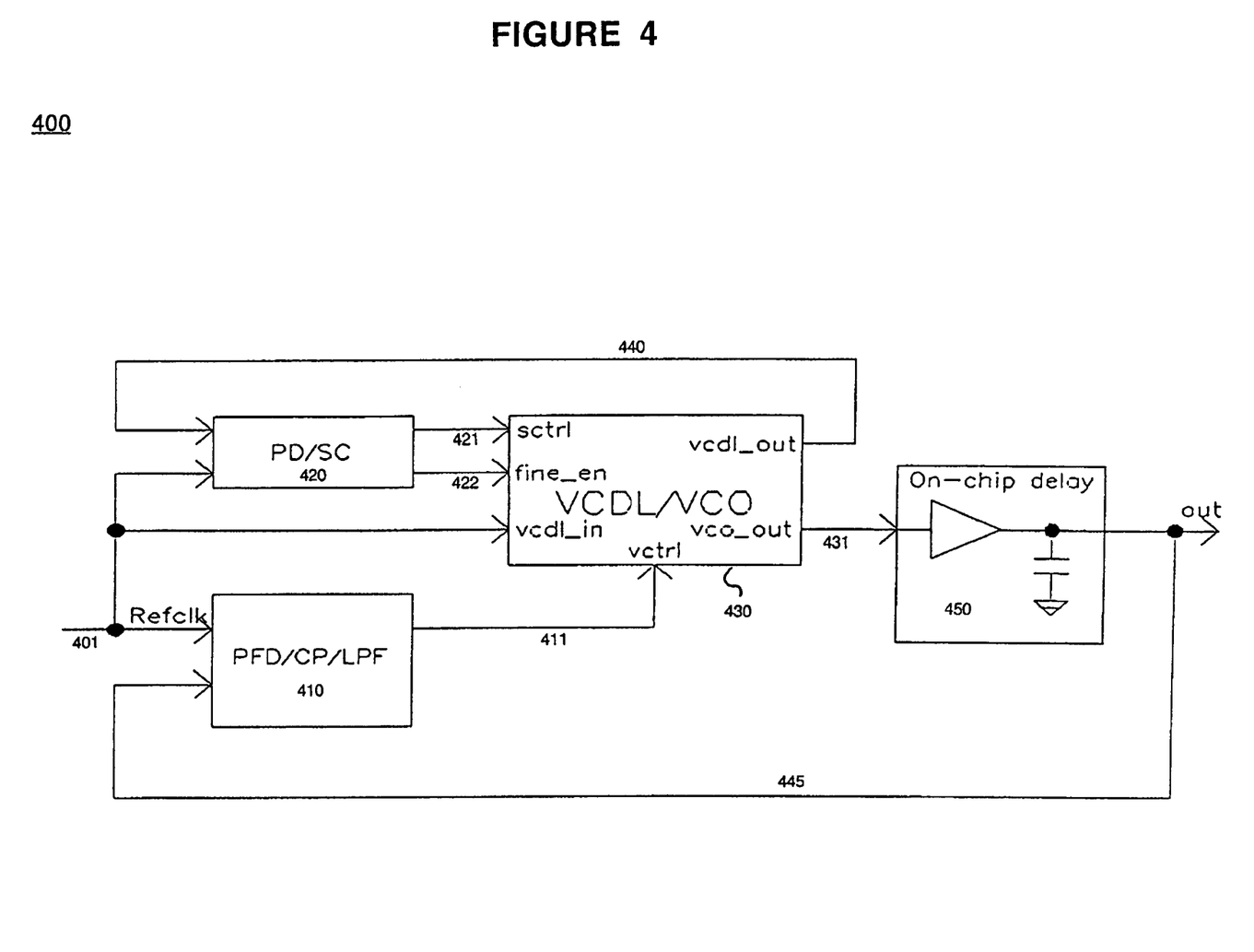
FIG. 4 is a block diagram of a circuit for generating a plurality of phases of an input signal in accordance with embodiments of the present invention that utilize dynamically determined VCO/VCDL operational states.

FIG. 4 is a block diagram of a circuit for generating a plurality of phases of an input signal in accordance with embodiments of the present invention having the dynamically determined VCO/VCDL states described above. In the embodiment of FIG. 4, an input signal 401 path is an input (e.g., Refclk) to a phase-frequency detector module 410 comprising a phase-frequency detector, a charge pump and a low pass filter. Input signal 401 path is also an input to a phase detector module 420 comprising a phase detector and a shift control. Input signal path 401 is also an input (e.g., vcdl_in) to a phase generator module 430 which can be configured in accordance with embodiments of the present invention as a voltage controlled delay line or a voltage controlled oscillator.

One output of phase generator 430 is a feedback line 440 which is also an input to phase detector module 420. Another output of phase generator 430 is an input 431 to an on-chip delay element 450 which comprises a buffer, a capacitor connected between the output of the buffer and ground, and an output of on-chip delay element 450. An output of on-chip delay element 450 is coupled with a feedback line 445 which is an input to phase-frequency detector module 410. An output of phase-frequency detector module 410 (e.g., vctrl signal path 411) is an input of phase generator 430. A first output (e.g., sctrl signal path 421) of phase detector 420 is an input of phase generator 430 and a second output (e.g., fine_en signal path 422) of phase detector 420 is an input of phase generator 430. Control line 422 implements the dynamic configuration of circuit 430 in the VCDL and VCO operational nodes.

Figure 5:
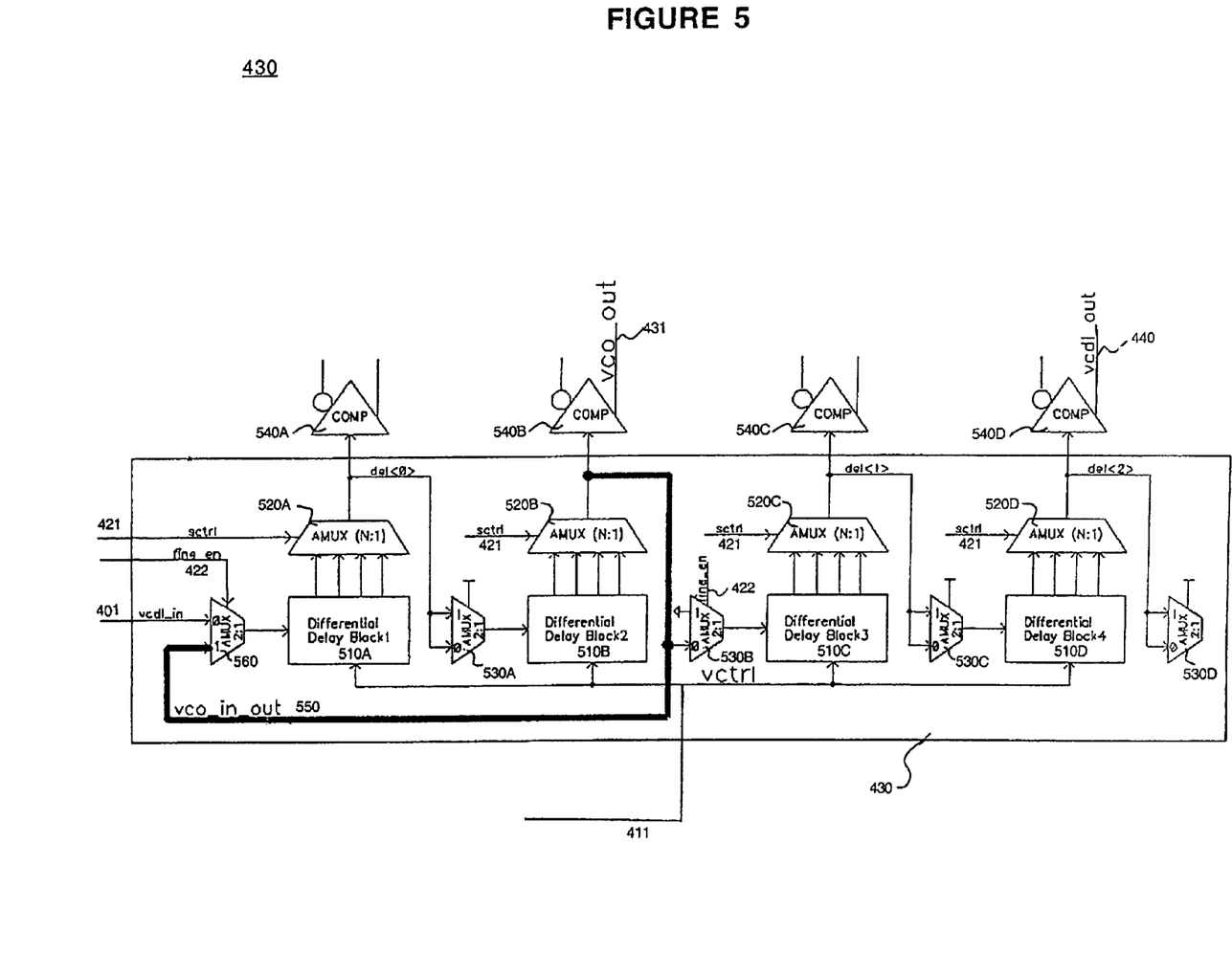
FIG. 5 is a block diagram of an exemplary phase generator in accordance with embodiments of the present invention.

FIG. 5 is a circuit diagram of an exemplary phase generator 430 in accordance with embodiments of the present invention. In the embodiment of FIG. 5, phase generator 430 comprises a plurality of delay blocks 510a–510d. Each of delay blocks 510a–510d is coupled with a respective multiplexor 520a–520d. In embodiments of the present invention, each of the delay blocks 510 comprises a plurality of delay elements that are, in one embodiment, coupled in series configuration. Additionally, an output of each of the delay elements of each delay block comprises an input to a multiplexor 520. The multiplexor therefore allows configurable delay through circuit 510 depending on the select line control. In one configuration, the output of the multiplexor is fed to the next delay stage. While FIG. 5 shows 4 inputs from each of the delay blocks 510, it is appreciated that each delay block may comprise a greater or lessor number of delay elements in accordance with embodiments of the present invention.

Figure 6:
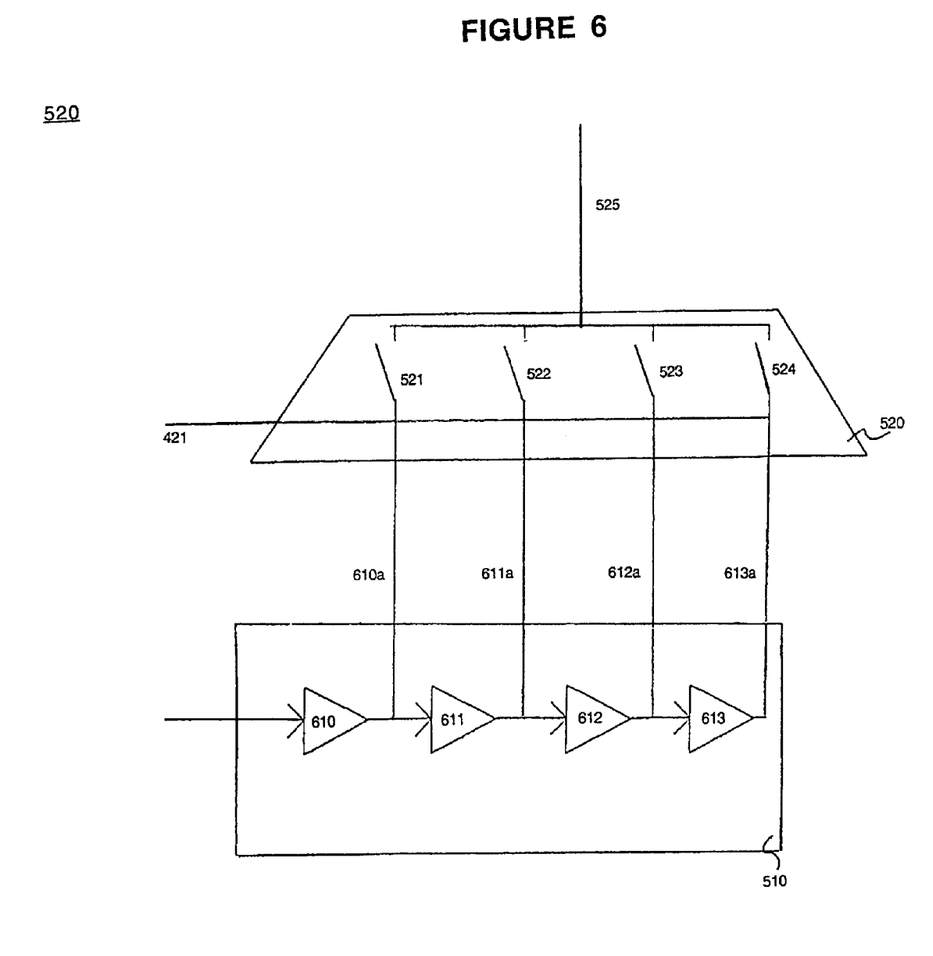
FIG. 6 shows an exemplary multiplexor used in accordance with embodiments of the present invention.

The following discussion will refer to FIG. 6, which shows an exemplary multiplexor 520 used in accordance with embodiments of the present invention. In the embodiment of FIG. 6, a plurality of delay elements 610–613 are coupled in series. Additionally, an output 610a–613a of each of the delay elements comprises an input to multiplexor 520. Multiplexor 520 comprises a plurality of switches 521–524 which are controlled by a signal, received via the sctrl signal path 421, generated by phase detector 420. This signal causes multiplexor 520 to selectively couple the delay elements with the output line 525, and thus with feedback line 440. In one configuration, the output of the multiplexor is fed to the next delay stage. Thus, in response to a control signal from phase detector 420, the difference in phases between the input signal (e.g., Refclk 401) and the output of vcdl_out (e.g., via feedback line 440 of FIG. 4) can be coarsely adjusted by coupling a greater/lessor number of delay elements 610–613. In VCDL mode, multiplexors 560, 530a, 530b and 530c select from input 0.

Regarding the selective coupling of delay elements, one signal sent via sctrl signal path 421 causes multiplexor 520 to close switch 521, thus coupling only delay element 610 of the delay circuit stage 510 with feedback line 440. Another signal sent via sctrl signal path 421 causes multiplexor 520 to instead close switch 522, thus coupling delay elements 610 and 611 of circuit stage 510 with feedback line 440 and introducing a greater change in phase Refclk signal 401 and vcdl_out. It is appreciated that all circuits 510a–510d behave in this manner in embodiments of the present invention.

The ability to dynamically control or configure the number of delay elements in a phase generating circuit is advantageous over conventional implementations because the number of delay elements is typically fixed in a PLL (FIG. 1) or a DLL (FIG. 2). As a result, the ability to change the phase of the output signal using a control voltage is limited in conventional designs because a change in the control voltage results in a fixed increment/decrement of the phase change of the output signal. Additionally, at low supply voltages, the range of voltages available to control the delay time is limited in conventional designs. As a result, changes in the vctrl voltage typically results in changes from very low frequencies to very high frequencies.

However, in the embodiments of present invention, the ability to first coarsely match the phases of the input signal with the output signal, by dynamically adding or subtracting delay elements 610–613, results in greater precision when later controlling the delay time of the delay elements using the control signal (e.g., vi vctrl signal path 411 of FIG. 4) output by phase-frequency detector module 410.

Returning again to FIG. 5, the output from multiplexors 520a–520d of each stage is input to a plurality of multiplexors 530a–530d of the next stage and then to comparitors 540a–540d. One output from comparator 540b the comprises the input 431 to on-chip delay element 450 (FIG. 4) when phase generator 430 is operated as a voltage controlled oscillator. One output from comparator 540d comprises the input to feedback line 440 when phase generator 430 is operated as a voltage controlled delay line. The sctrl signal path 421 is an input to each of the multiplexors 520a–520d for controlling the number of delay elements of each of delay blocks 510a–510d. The fine_en signal path 422 comprises an input to multiplexor 560 which controls which signal (e.g., vcdl_in signal path 401 or vco_in_out signal path 550) will be the input of differential delay block 510a and also controls the multiplexors 530a–530c which effectively configures circuit 430 in either VCO or VCDL modes.

When operated in a phase locked loop mode, circuit 400 supports generating multiple phases of the input signal received via Refclk 401 while suppressing skew. In so doing, circuit 400 can support a wider frequency range (e.g., $f_{max}/f_{min} > 6$) than conventional art circuits and at a low supply voltage.

Figure 7:
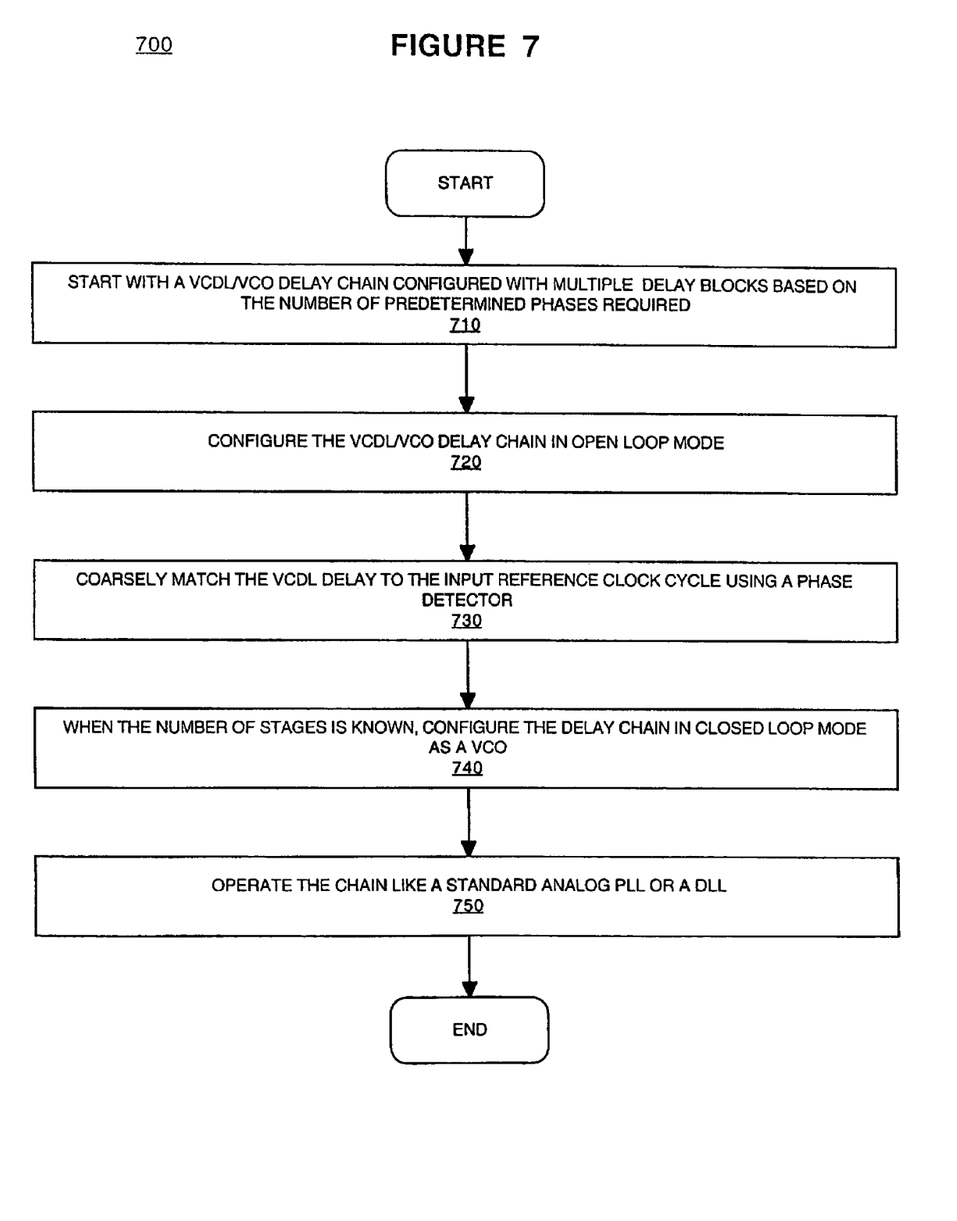
FIG. 7 is a detailed flow diagram of the operation of one embodiment of the present invention.

The following discussion refers to FIG. 4, FIG. 5 and FIG. 7 to explain the operation of circuit 400. With reference to step 710 of FIG. 7, circuit 400 comprises a VCDL/VCO delay chain configured with multiple delay blocks based on the number of predetermined phases required. For example, embodiments of the present invention may utilize a greater or lessor number of delay blocks (e.g., delay blocks 510a–510d of FIG. 5). As discussed above, the input signal path (e.g., vcdl_in signal path 401) is an input to phase-frequency detector 410, phase detector 420, and phase generator 430. Within phase generator 430, the vcdl_in signal path 401 is input to multiplexor 560 and then to delay block 510a as a result of the signal input to multiplexor 560 via fine_en signal path 422 (e.g., fine_en=0). As discussed above, circuit 400 can initially be configured in a delay lock loop, or "open loop," mode with an initial number of delay circuits configured. Thus, the input signal is sent from delay block 510*a* to multiplexor 520*a* and then to multiplexor 530*a*. The input signal 401 then passes through delay block 510*b* the next stage, multiplexor 520*b* and multiplexor 530*b* where, due to the signal sent via fine_en signal path 422 being set at 0, the input signal is sent to delay block 510*c* the next stage. From there, the input signal passes to multiplexor 520*c*, multiplexor 530*c*, delay block 510*d*, the next stage multiplexor 520*d*, and comparitor 540*d*. This corresponds to step 720 of FIG. 7. Again, while the present embodiment recites four delay block stages, embodiments of the present invention are well suited for using a greater or lessor number of delay blocks depending upon the number of phases of the input signal need to be generated.

Because one of the outputs of comparitor 540*d* is the input to feedback line 440, the input signal and the vcdl_out signal are inputs which are compared by phase detector 420. However, because the signal that has passed through phase generator 430 has passed through at least one of the delay elements (e.g., delay elements 610–613 of FIG. 6) of each of the delay blocks 510*a*–510*d*, the signal output by phase generator 530 is out of phase with the input signal. For example, for there to be a complete signal path from input signal 401 to feedback line 440, at least one of the delay elements 610–613 of each of the delay blocks must be selectively coupled by multiplexors 520*a*–520*d*.

Referring now to step 730 of FIG. 7, the VCDL delay is coarsely matched to the input reference clock cycle using a phase detector. Phase detector 420 compares the input signal 401 with the vcdl_out signal that is received via feedback line 440 and generates a control signal via sctrl signal path 421 to selectively couple more or less delay elements of the delay stages to the signal path of phase generator 430 to increase or decrease the difference in phases between input signal 401 and the vcdl_out signal. For example, one of the delay elements (e.g., delay element 610 of FIG. 6) of each of the delay blocks may initially be coupled with the signal path of phase generator 430. Phase detector 420 compares the input signal and the vcdl_out signal and determines that a greater amount of delay is needed. Phase detector 420 then generates a control signal via sctrl signal path 421 causing the multiplexors to disengage switch 521 and engage switch 522, thus coupling two delay elements (e.g., delay elements 610 and 611) from delay block 520 in the signal path of phase generator 430. This causes a greater amount of delay in the vcdl_out signal. In embodiments of the present invention, phase detector 420 continues this process until a coarse match between the input signal and a desired phase difference with the vcdl_out signal is achieved.

Referring now to step 740 of FIG. 7, when the number of stages (e.g., delay elements 610 and 611 of FIG. 6) is known, the delay chain is configured in a closed loop mode as a VCO. In embodiments of the present invention, when phase detector 420 determines that a sufficient match between the phases of the two signals or a "coarse lock," has been achieved, it then generates a second signal via fine_en signal path 422 for dynamically switching circuit 430 from a delay lock loop mode to a phased locked loop, or""closed loop," mode. In embodiments of the present invention, this signal determines which signal path either vcdl_in 401 or vco_in_ out, will be the input for delay block 510*a*. This signal also couples/decouples multiplexor 530*b* with the signal path for phase generator 430. After switching to a phase locked loop mode, the input signal received via vcdl_in signal path 401 is disengaged and the vco_in_out signal path 550 is now the input to delay block 520*a*. In this mode, the delay stages associated with circuits 510*c* and 510*d* are bypassed.

For instance, in embodiments of the present invention, when phase generator 430 is operated in a phase locked loop mode, the output of multiplexor 520*b* is no longer an input to multiplexor 530*b*. This is because the same control signal sent via fine_en signal path 422 which decoupled the vcdl_in signal path 401 from multiplexor 560 simultaneously decoupled multiplexor 530*b* from the signal path of phase generator 430. Instead, vco_in_out signal path 550 now couples the output of multiplexor 520*b* with an input or multiplexor 560. As a result, delay blocks 510*c* and 510*d* may be used to generate a plurality of phases of a second input or clock signal (e.g., supplied via input 1 of multiplexor 530*b*). Thus, in embodiments of the present invention, when phase generator 430 is operated in a phase locked loop mode, phase generator 430 is operable for generating a plurality of phases of a second input signal (not shown).

Referring now to step 750 of FIG. 7, the delay chain is operated like a standard analog PLL or a DLL. When operating in a phase locked loop mode, an output of phase generator 430 (e.g., vco_out) is coupled with phase-frequency detector 410 via feedback line 445. Phase-frequency detector 410 compares this signal with the input signal received via signal path 401 and generates a control signal which controls the amount of delay of each of the delay elements coupled in the signal path of phase generator 430. For example, in embodiments of the present invention when the voltage sent via vctrl signal path 411 is raised, the amount of delay introduced by each of the delay elements is reduced. Alternatively, circuit 400 can continue to be operated in the open loop mode operating phase generator 430 as a voltage controlled delay line.

As a result, embodiments of the present invention support wide frequency ranges (e.g., $f_{max}/f_{min} > 6$) while supporting predetermined multiple clock phase generation. While doing so, embodiments of the present invention support skew suppression. Additionally, embodiments of the present invention require low VCO control voltage ranges and are compatible with low supply voltage systems. Embodiments of the present invention also require low VCO gain ($K_{vco}$) and exhibit less jitter than cascaded DLL circuits.

The preferred embodiment of the present invention, a wide frequency range DLL with dynamically determined VCDL/VCO operational states, is thus described. While the present invention has been described in particular embodiments, it should be appreciated that the present invention should not be construed as limited by such embodiments, but rather construed according to the following claims.

What is claimed is:

1. A circuit for generating a plurality of phases of an input signal comprising:
   a phase generator operable as a voltage controlled oscillator and as a voltage controlled delay line, said phase generator comprising a plurality of delay blocks;
   a phase detector coupled in a first feedback loop with said phase generator, said phase detector for comparing said input signal with a first output signal of said phase generator when in a delay lock loop mode and for generating a first control signal to said phase generator to switch from said delay lock loop mode to said phase locked loop mode; and
   a phase-frequency detector coupled in a second feedback loop with a phase generator, said phase, frequency detector for comparing said input signal with a second output signal of said phase generator when in said phase locked loop mode.

2. The circuit of claim 1 further comprising a delay element disposed in said second feedback loop between said phase generator and said phase-frequency detector and wherein said delay element generates an output signal.

3. The circuit of claim 2 wherein said phase generator is operable for generating a plurality of phases of said second output signal when operating in said phase locked loop mode.

4. The circuit of claim 1 wherein each of said plurality of delay blocks comprises a plurality of delay elements coupled in series.

5. The circuit of claim 4 wherein each delay block is associated with a respective multiplexer for configuring a number of said plurality of delay elements coupled in series.

6. The circuit of claim 5 wherein a second control signal generated by said phase detector causes said multiplexers to dynamically select the number of said plurality of delay elements that are coupled in series.

7. The circuit of claim 4 wherein said second control signal generated by said phase-frequency detector controls a delay time of each of said plurality of delay elements.

8. The circuit of claim 7 wherein said circuit suppresses skew of said plurality of phases of said input signal.

* * * * *